United States Patent
Brunschwiler et al.

(10) Patent No.: US 9,941,250 B2
(45) Date of Patent: *Apr. 10, 2018

(54) CHIP STACK STRUCTURES THAT IMPLEMENT TWO-PHASE COOLING WITH RADIAL FLOW

(71) Applicant: International Business Machines Corporation, Armonk, NY (US)

(72) Inventors: Thomas J. Brunschwiler, Rueschlikon (CH); Evan G. Colgan, Chestnut Ridge, NY (US); John U. Knickerbocker, Monroe, NY (US); Bruno Michael, Zurich (CH); Chin Lee Ong, Horgen (CH); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/403,430

(22) Filed: Jan. 11, 2017

(65) Prior Publication Data

US 2017/0125388 A1    May 4, 2017

Related U.S. Application Data

(63) Continuation of application No. 15/041,213, filed on Feb. 11, 2016, now Pat. No. 9,648,782, which is a
(Continued)

(51) Int. Cl.
*H05K 7/20* (2006.01)
*H01L 25/065* (2006.01)
(Continued)

(52) U.S. Cl.
CPC ........ *H01L 25/0657* (2013.01); *H01L 23/427* (2013.01); *H01L 25/50* (2013.01);
(Continued)

(58) Field of Classification Search
None
See application file for complete search history.

(56) References Cited

U.S. PATENT DOCUMENTS 5,183,844 A    2/1993    Vives
5,274,920 A    1/1994    Matthews
(Continued)

FOREIGN PATENT DOCUMENTS

WO    2009037648 A2    3/2009

OTHER PUBLICATIONS

G. Bognar et al., "Thermal Characterization of a Radial Micro-Channel Cooling Plate," IEEE 21st Annual Semiconductor Thermal Measurement and Management Symposium, Mar. 2005, pp. 135-140.
(Continued)

*Primary Examiner* — Robert Carpenter
(74) *Attorney, Agent, or Firm* — Louis J. Percello; Ryan, Mason & Lewis, LLP

(57) ABSTRACT

A package structure to implement two-phase cooling includes a chip stack disposed on a substrate, and a package lid that encloses the chip stack. The chip stack includes a plurality of conjoined chips, a central inlet manifold formed through a central region of the chip stack, and a peripheral outlet manifold. The central input manifold includes inlet nozzles to feed liquid coolant into flow cavities formed between adjacent conjoined chips. The peripheral outlet manifold outputs heated liquid and vapor from the flow cavities. The package lid includes a central coolant supply inlet aligned to the central inlet manifold, and a peripheral liquid-vapor outlet to output heated liquid and vapor that exits from the peripheral outlet manifold. Guiding walls may be included in the flow cavities to guide a flow of liquid and vapor, and the guiding walls can be arranged to form radial
(Continued)

flow channels that are feed by different inlet nozzles of the central inlet manifold.

19 Claims, 6 Drawing Sheets

Related U.S. Application Data continuation of application No. 14/015,063, filed on Aug. 30, 2013, now Pat. No. 9,313,921.

(60) Provisional application No. 61/761,021, filed on Feb. 7, 2013, provisional application No. 61/694,985, filed on Aug. 30, 2012.

(51) Int. Cl.
*H01L 25/00* (2006.01)
*H01L 23/427* (2006.01)

(52) U.S. Cl.
CPC ............ *H01L 2225/06513* (2013.01); *H01L 2225/06541* (2013.01); *H01L 2225/06555* (2013.01); *H01L 2225/06582* (2013.01); *H01L 2225/06589* (2013.01); *H01L 2225/06593* (2013.01)

(56) References Cited

U.S. PATENT DOCUMENTS

| | | | |
|---|---|---|---|
| 7,104,312 | B2 | 9/2006 | Goodson et al. |
| 7,626,260 | B2 | 12/2009 | Chung et al. |
| 7,795,726 | B2 | 9/2010 | Myers et al. |
| 7,928,563 | B2 | 4/2011 | Bakir et al. |
| 7,990,711 | B1 | 8/2011 | Andry et al. |
| 9,648,782 | B2 * | 5/2017 | Brunschwiler .... H05K 7/20381 |
| 2005/0151244 | A1 | 7/2005 | Chrysler et al. |
| 2009/0251862 | A1 | 10/2009 | Knickerbocker et al. |
| 2012/0001348 | A1 | 1/2012 | Baek et al. |
| 2012/0061059 | A1 | 3/2012 | Hsiao et al. |

OTHER PUBLICATIONS

A. Bejan et al., "Constructual Theory of Generation of Configuration in Nature and Engineering," Journal of Applied Physics, Jun. 2006, 27 pages, vol. 100.

M.S. Bakir et al., "3D Heterogeneous Integrated Systems: Liquid Cooling, Power Delivery, and Implementation," IEEE Custom Integrated Circuits Conference (CICC), Sep. 2008, pp. 663-670.

\* cited by examiner

400

500

600

CHIP STACK STRUCTURES THAT IMPLEMENT TWO-PHASE COOLING WITH RADIAL FLOW

TECHNICAL FIELD

The field generally relates to structures and methods for cooling three-dimensional (3D) chip packages and, in particular, 3D chip stacks having integrated cooling structures with a central inlet manifold to implement two-phase cooling with radial flow.

BACKGROUND

In general, it is important to cool semiconductor chips, such as processor chip, to maintain reliable operation and prevent thermal damage to electronic components. It is more problematic and difficult to implement effective mechanisms for cooling 3D chip stacks as compared to singular chips, and the ability to efficiently cool a chip stack can limit the height and total power of a chip stack. Common cooling techniques for chip stacks include the use of high-performance water cooling systems on a backside of the chip stack, but this technique is not adequate for a stack structure with many chips or a chip stack having a high-power chip on a bottom of the stack. While a water-cooled thermal interposer can be used at the bottom of the chip stack, this structure is difficult to integrate and requires isolation of thru silicon vias (TSVs) from the liquid coolant that is used. If a dielectric fluid is used as the coolant, isolation of the TSVs is not required. With single phase cooling, the performance of dielectric fluids is inferior to water.

Other cooling techniques include two-phase cooling in which a liquid coolant having a relatively low boiling point is used (e.g., liquid which evaporates at an operating temperature of the chips being used). With two-phase cooling in closed channels, the heated liquid evaporates to create an annular flow wherein a thin liquid film (evaporation layer) is present on the surfaces being cooled, and heated evaporated coolant flows through confined channels outlet ports. With this cooling process, the latent heat of the liquid coolant is typically much larger than the specific heat of the fluid times the typical temperature increase of the liquid coolant. As such, as compared to pure liquid cooling techniques, two-phase cooling can provide greater cooling ability using a much lower volume of coolant fluid, lower coolant mass flow rates and lower operating pressure. Advantages of two-phase cooling include the ability to select the boiling temperature of the coolant or use an expansion valve for refrigeration.

However, it is very difficult and problematic to control two-phase flow through microchannels or other manifold structures that are typically used for two-phase cooling systems. Indeed, a two-phase flow tends to be unstable and can vary in the same or different regions of a microchannel or manifold structure. Moreover, the increased volume of the vapor phase results in high vapor velocity causing substantial pressure drops and potentially disrupts the thin evaporation layer on the channel walls, leading to local dry out (i.e., dewetting of surfaces to be cooled).

SUMMARY

In general, embodiments of the invention include chip package structures having integrated cooling structures to implement two phase cooling with radial liquid-vapor flow. In one embodiment of the invention, a package structure includes a chip stack disposed on a substrate, and a package lid which covers and encloses the chip stack. The chip stack includes a plurality of conjoined chips, a central inlet manifold formed through a central region of the chip stack, and a peripheral outlet manifold. The central input manifold includes a plurality of inlet nozzles to feed liquid coolant from the central input manifold into flow cavities formed between adjacent conjoined chips in the chip stack. The peripheral outlet manifold is formed by the flow cavities around a periphery of the chip stack to output heated liquid and vapor which exits from the flow cavities. The package lid includes a central inlet that is aligned to the central inlet manifold of the chip stack to supply liquid coolant to the central inlet manifold, and a peripheral liquid-vapor outlet that is aligned to an interior region of the package lid which collects the heated liquid and vapor that is output from the peripheral outlet manifold of the chip stack.

In another embodiment of the invention, the flow cavity formed between a first and second chip in the chip stack includes guiding walls that are arranged to guide a flow of liquid and vapor. In one embodiment, the guiding walls are arranged to form radial flow channels that are fed by different inlet nozzles of the central inlet manifold.

These and other embodiments of the invention will be described or become apparent from the following detailed description of embodiments, which is to be read in conjunction with the accompanying drawings.

DETAILED DESCRIPTION

Exemplary embodiments of chip packages having integrated cooling structures to implement two phase cooling with radial liquid-vapor flow will now be discussed in further detail with initial reference to FIGS. 1, 2, and 3. It is to be understood that the various layers, regions, and structures shown in the accompanying drawings are not drawn to scale. Moreover, the same or similar reference numbers used throughout the drawings are used to denote the same or similar features, elements, or structures, and thus, a detailed explanation of the same or similar features, elements, or structures will not be repeated for each of the drawings.

Figure 1:
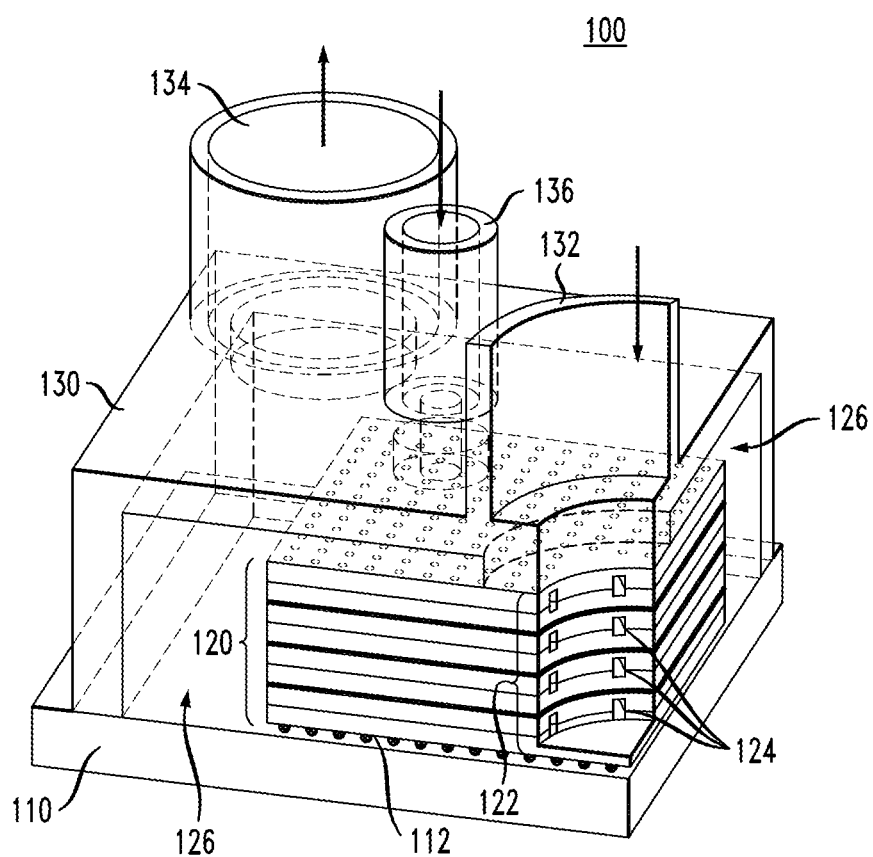
FIG. 1 is a perspective view of a portion of a chip package having integrated cooling structures to implement two phase cooling with radial liquid-vapor flow, according to an embodiment of the invention.

FIG. 1 is a perspective view of a portion of a chip package 100 having integrated cooling structures for implementing two phase cooling with radial liquid-vapor flow, according to an embodiment of the invention. More specifically, FIG. 1 schematically illustrates one quadrant of a chip package 100 comprising a substrate 110 (e.g., ceramic substrate) and a stack of conjoined chips 120 (chip stack), which is electrically connected and bonded to the substrate 110 via an array of solder balls 112 (e.g. micro BGA or C4). The chip package 100 further comprises a package lid 130 having plurality of inlet and outlet ports including a central inlet 132, a peripheral liquid-vapor outlet 134, and an optional hot spot feed inlet 136.

As further shown in FIG. 1, the chip stack 120 comprises a central inlet manifold 122 that is aligned to the central inlet 132 of the package lid 130. In one embodiment of the invention, the central inlet manifold 122 is a 2 mm diameter bore that is formed through a center region of each chip (except the bottom chip) in the chip stack 120. An external source of liquid coolant supplies liquid coolant through the central inlet 132 of the package lid 130 into the central inlet manifold 122 of the chip stack 120. A plurality of inlet nozzles 124 are formed along the sidewall of the central inlet manifold 122 of the chip stack 120. The inlet nozzles 124 are flow restrictions for feeding liquid coolant into flow cavities that are formed between pairs of conjoined chips in the chip stack 120. As the liquid coolant flows thought the radial flow cavities, the liquid evaporates resulting in annular flow or other flow patterns. The heated liquid/vapor exits out from the radial flow cavities at the peripheral sidewalls around the chip stack 120, and flows into an output manifold region 126 within a peripheral interior region of the package lid 130. The heated liquid/vapor exits out through the peripheral liquid-vapor outlet 134.

Figure 2:
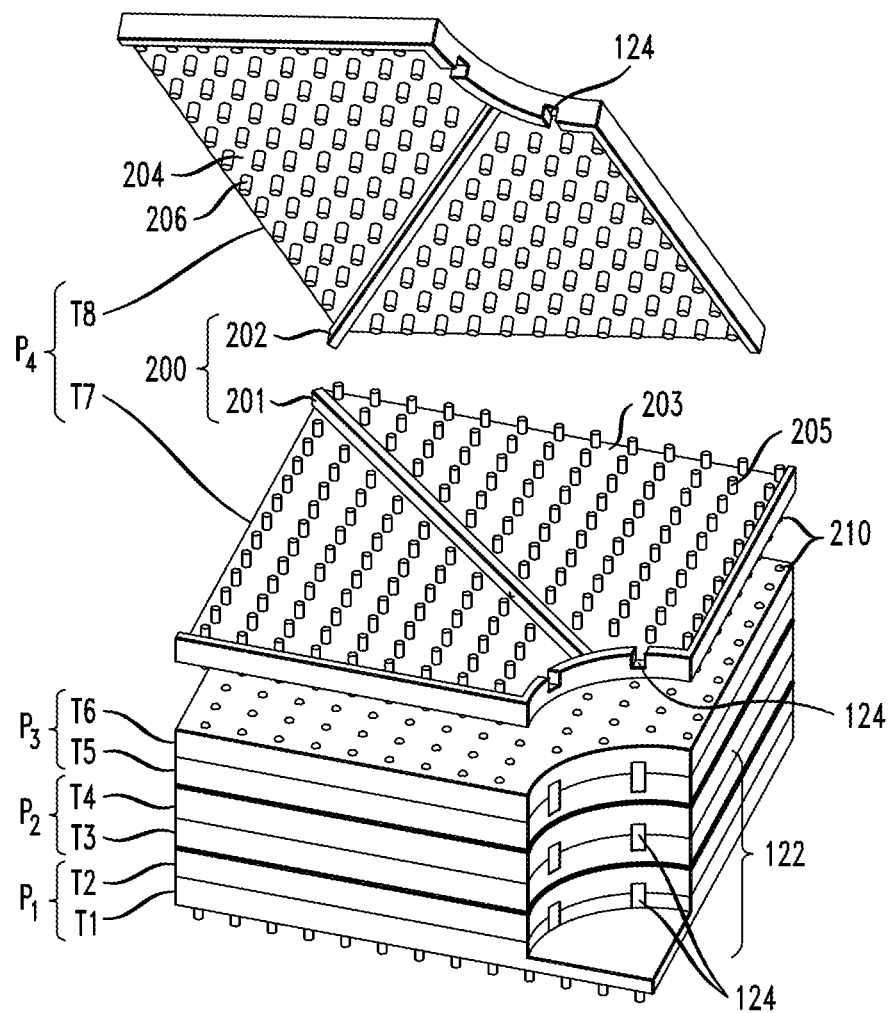
FIG. 2 is an exploded perspective view of a stack of conjoined chips having a central feed inlet manifold and radial flow cavity structures formed between pairs of conjoined chips to implement two phase cooling with radial liquid-vapor flow, according to an embodiment of the invention.
Figure 3:
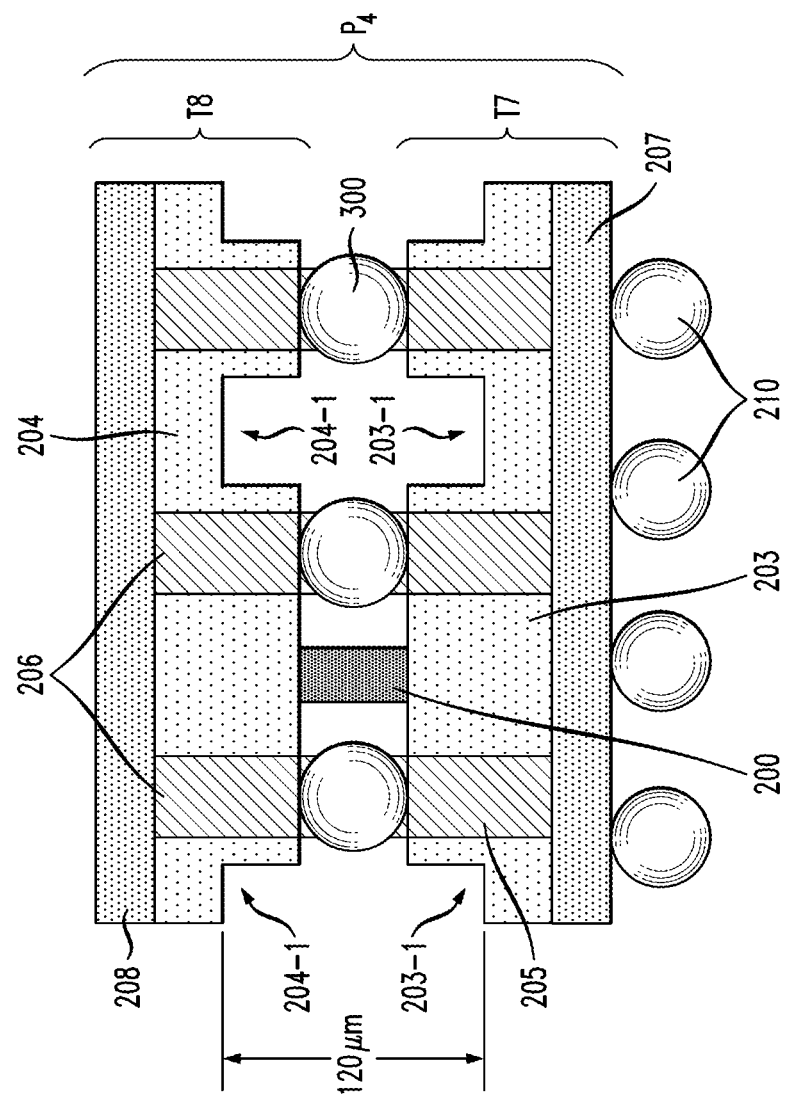
FIG. 3 schematically illustrates method for bonding two chips back-to-back to form radial flow cavities and guiding structures for two-phase cooling, according to an embodiment of the invention.

FIGS. 2 and 3 illustrate details of radial flow cavities formed between pairs of conjoined chips in the chip stack 120. For example, FIG. 2 is an exploded perspective view of a stack of conjoined chips having a central feed inlet manifold and radial flow cavity structures formed between pairs of conjoined chips, according to an embodiment of the invention. In particular, FIG. 2 illustrates an embodiment of the chip stack 120 shown in FIG. 1, wherein the chip stack 120 comprises four pairs P1, P2, P3, and P4 of conjoined chips T1/T2, T3/T4, T5/T6, and T7/T8, respectively. FIG. 2 is an exploded perspective illustration of a bonding interface between the pair P4 of chips T7 and T8. Moreover, FIG. 3 schematically illustrates method for bonding two chips back-to-back to form radial flow cavities and guiding structures for two-phase cooling, according to an embodiment of the invention. In particular, FIG. 3 shows are portion of the bonding interface between backside surfaces of the pair P4 of chips T7 and T8 shown in FIG. 2.

Referring to FIGS. 2 and 3, radial flow cavities are formed by bonding the backside (inactive) surfaces of the chips T7 and T8 together, with one or more guiding walls 200 interposed between the backside surfaces to confine the flow of liquid-vapor coolant in different regions of the chip area as the coolant flows from the inlet nozzles 124 to the outlet manifold 126. In particular, the chip T7 has a backside surface 203, and a plurality of TSVs 205 formed through the chip T7 to a front side (active) surface 207 of the chip T7. Similarly, the chip T8 has a backside surface 204, and a plurality of TSVs 206 formed through the chip T8 to a front side (active) surface 208 of the chip T8. The array of TSVs 205 formed in the backside surface 203 of the chip T7 are aligned to the array of TSVs 206 formed in the backside surface 204 of the chip T8 so the chip pair P4 can be bonded together using suitable solder ball connections 300 and provide electrical interconnects between components on the active surfaces 207 and 208 of the chips T7 and T8. As further shown in FIGS. 2 and 3, an array of micro solder balls 210 is used to connect the front side surfaces chips in adjacent chip pairs mechanically bond the chip pairs P1, P2, P3, P3 together in a stack structure, and provide electrical connections between adjacent chip pairs. For example, as illustrated by FIGS. 2 and 3, the array of micro solder balls 210 provides bonding and electrical connections between the active surface of the chips T7 and T6.

Furthermore, in one embodiment of the invention, in regions of the backside surface silicon between the TSVs 205, 206, channels 203-1 and 204-1 are formed in the backside silicon surfaces 203 and 204 of the chips T7 and T8, respectively, to provide greater area/volume for the flow of liquid coolant/vapor, and allow the coolant/vapor to be in closer proximity to the active components in front side surfaces 207 and 208 which generate heat. In one embodiment of the invention, a 120 µm high fluid cavity can be achieved using 70 µm high solder balls 300 (150 µm pitch) and two 50 µm thick Si (silicon) chips with 25 µm deep channels.

Guiding walls can be provided to direct and control the flow of the liquid and vapor. The guiding walls can be formed of various materials such as polymer material (e.g., SU8), metallic material, or in combination with etching channels around the guiding walls in the backside silicon surfaces of the chips. As shown in FIG. 2, the guiding wall 200 may be formed by a first portion 201 formed on the backside surface 203 of the chip T7 and a second portion 202 formed on the backside surface 204 of the chip T8, wherein the first and second portions 201 and 202 are aligned and bonded together when conjoining the chips T7 and T8. The height of the guiding wall structure 200 should be less than or equal to the joined height of micro solder ball 300. Although FIGS. 2 and 3 illustrate a single guiding wall 200 formed between the chip pair P4 in one quadrant of the chip stack 120, various arrangement and structures of guiding walls can be formed depending on the give application, details of which will be explained below with reference to FIGS. 4 and 5.

Figure 4:
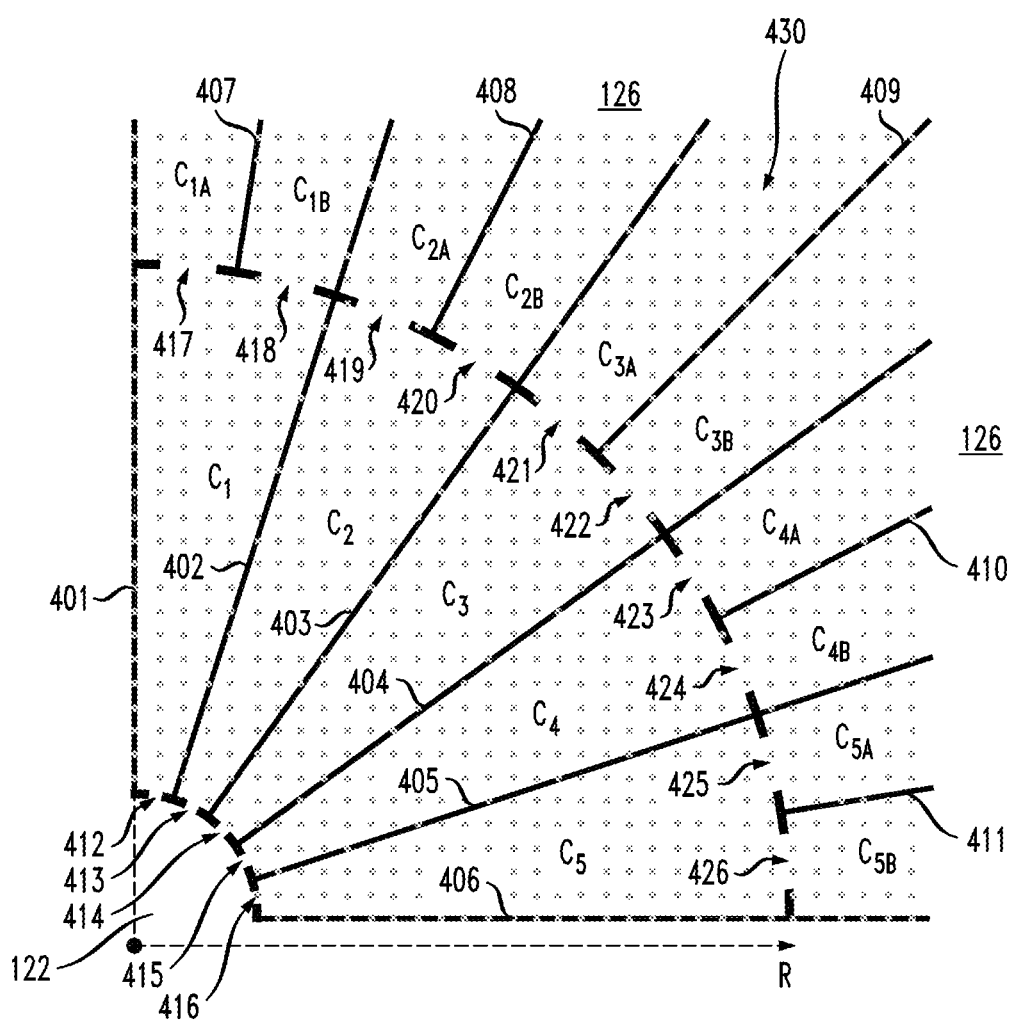
FIG. 4 illustrates one quadrant of an arrangement of guiding structures that form radial flow channels for implementing two phase cooling with radial liquid-vapor flow, according to an embodiment of the invention.

For instance, FIG. 4 illustrates one quadrant of an arrangement of guiding structures that form radial channels for implementing two phase cooling with radial liquid-vapor flow, according to an embodiment of the invention. In particular, FIG. 4 illustrates a hierarchical arrangement of radial flow channels 400 formed by a plurality of guiding wall structures in one quadrant of the interface between two chip pairs, according to an embodiment of the invention. The hierarchical arrangement of radial flow channels 400 comprises a plurality of radial flow channels C1, C2, C3, C4, and C5 that begin at a central inlet manifold 122. The plurality of radial flow channels C1, C2, C3, C4, and C5 are defined in part by guiding walls 401, 402, 403, 404, 405 and 406. A plurality of inlet nozzles 412, 413, 414, 415 and 416 feed liquid coolant into the radial flow channels C1, C2, C3, C4, and C5, respectively.

As further shown in FIG. 4, at some radial distance R from the center point of the central input manifold 122, each radial flow channel C1, C2, C3, C4, and C5 is further divided into two separate radial flow channels C1A/C1B, C2A/C2B, C3A/C3B, C4A/C4B, and C5A/C5B, respectively. A plurality of second inlet nozzles 417, 418, 419, 420,

421, 422, 423, 424, 425 and 426 feed coolant/vapor into the sub-radial flow channels C1A, C1B, C2A, C2B, C3A, C3B, C4A, C4B, C5A, and C5B, respectively. The number of hierarchy levels could be extended and is not limited to two. Also shown in FIG. 4 is an array of micro solder balls 300, which in combination with TSVs provide electrical interconnects between the chips in the stack.

Figure 5:
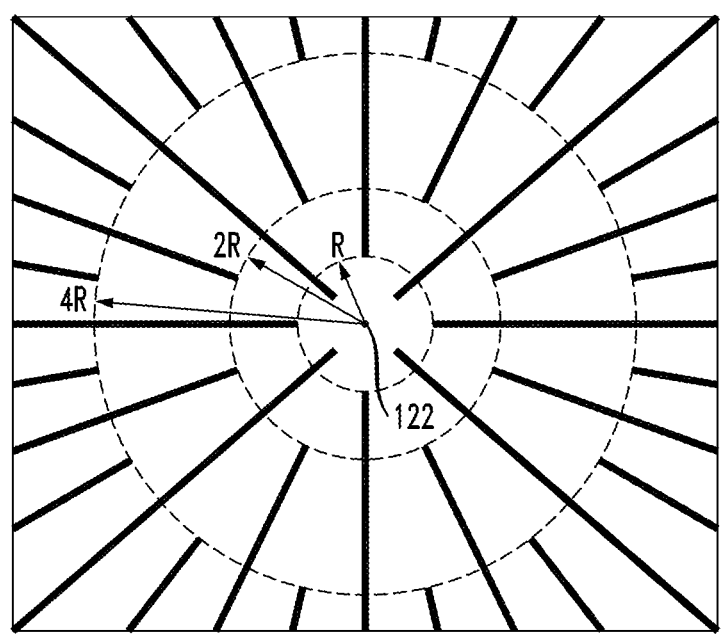
FIG. 5 illustrates an arrangement of guiding structures that form radial channels for implementing two phase cooling with radial liquid-vapor flow, according to another embodiment of the invention.

FIG. 5 illustrates an arrangement of guiding structures that form radial flow channels for implementing two-phase cooling with radial liquid-vapor flow, according to another embodiment of the invention. In particular, FIG. 5 illustrates a hierarchical arrangement of radial flow channels 500 formed by a plurality of guiding wall structures in an entire region (4 quadrants) of an interface between two chip pairs, according to an embodiment of the invention. The hierarchical arrangement of radial flow channels 500 comprises a plurality of radial flow channels similar to that described above with reference to FIG. 4. However, in the embodiment of FIG. 5, the initial radial flow channels are divided into two radial flow channels as some radial distance R from the center point of the central input manifold 122, and further divided into two more radial flow channels as some radial distance 2R from the center point of the central manifold 122, and then further divided once more into two radial flow channels as some radial distance 4R from the center point of the central input manifold 122.

With a radial flow configuration as depicted in FIGS. 4 and 5, for example, there is an expanding cross sectional area along the radial flow channels (wherein the channel width increases proportional to the circumference, which scales with the radius), which results in a reduction of vapor-liquid acceleration, compared to straight channels. This reduction in vapor-liquid acceleration, in turn, reduces pressure drops and improves the critical heat flux. A benefit of a branching radial flow channel network is that the flow speed (and pressure drop) is reduced as the channel cross-section increases, thus maintaining an annular regime with a relatively thick evaporating film along surfaces of the radial flow cavities. The guiding walls with the nozzles result in a stable flow condition and prevents by-passing of refrigerant of high heat flux areas. The guiding walls (in combination with the inlet nozzles) allow the modulation of refrigerant mass flow towards respective channels.

Moreover, the inlet nozzles are designed to prevent back-flow and help equalize the flow between different zones. For example, one risk is that a dry-out can occur near corner regions of the chips because the flow-length from the center point of the central inlet manifold along a diagonal to a corner of the chip is longer than a line towards a side of the chip. In one embodiment of the invention, this is compensated by using larger cross-section/mass flux inlet nozzles to feed radial flow channels that point along these diagonal directions towards the chip corners, as compared to the inlet nozzles that feed the radial flow channels that point toward the sides of the chips.

For example, as shown in FIG. 4, the radial flow channel C3 is directed towards a corner of the chip, whereas the radial flow channel C5 is directed towards a side of the chip. As illustrated in FIG. 4, the inlet nozzle 414 that feeds the radial flow channel C3 is larger in cross-section (hydraulic radius) than that of the inlet nozzle 416 that feeds the radial flow channel C5. Similarly, the inlet nozzles 421 and 422 that feed the sub radial flow channels C3A and C3B, respectively, are larger in cross-section than that of the inlet nozzles 425 and 426 that feed the sub radial flow channels C5A and C5B. In one embodiment of the invention, the inlet nozzles that feed the radial flow channels along the diagonal are about 9% larger than those inlet nozzles that feed the radial flow channels that point toward the sides of the chip.

In one embodiment of the invention, the inlet nozzles are formed using the same material as the guiding walls, e.g., using a layer of polymer material or metallic material that is formed on surfaces of the chips. In this embodiment, the opening sizes of the inlet nozzles can be varied by adjusting the lateral distance between the sides of the inlet nozzle openings (as shown in FIG. 4), as the vertical distance between the upper and lower surfaces of the conjoined chips is fixed. In another embodiment, the inlet nozzles are formed/patterned by etching the surfaces of the chips. In this embodiment, the opening sizes of the inlet nozzles can be varied by adjusting the vertical depth of the etch to adjust the distance between the upper and lower sides of the inlet nozzle openings, as the lateral distance of the inlet nozzles between input edges of the guiding walls is fixed.

In other embodiments of the invention, radial flow channels may be patterned or textured to reduce superheat. Moreover, the radial flow channels may be varied in size to correspond with different power densities by chip layer or location on a given chip. In another embodiment, a channel width of a radial branching channel network can be modulated to specifically direct liquid coolant/refrigerant to hot spot locations. A flow channel network could be designed to focus multiple channels to hot spot locations.

In other embodiments of the invention, the interface between a pair of chips may not include any guiding wall structures, and simply include a pin array of micro solder bumps 300 with etched flow cavities (e.g., eliminate the guiding wall 200 shown in FIG. 2). With this embodiment, the liquid coolant will flow through the inlet nozzles 124 into the interior flow regions around the central inlet manifold 122, and simply flow towards the sides of the chips and exit out to the output manifold regions 126. However, a problem with a pin-fin array and sparse or not guiding structures is that the mainstream may follow a shortest path from the central inlet manifold 122 to the peripheral output manifold region 126, which results in less than optimal cooling along longer paths. Moreover, the existence of hot spot regions could result in dry out at some region of the coolant path due to the higher heat flux. Without guiding walls to direct the coolant flow towards hot spots, these regions may not be adequately cooled. For this reason, optimal cooling can be achieved with symmetrically branching radial flow channels that have a cross section that corresponds with an overall path-length and/or integrated power dissipated along the path.

Figure 6:
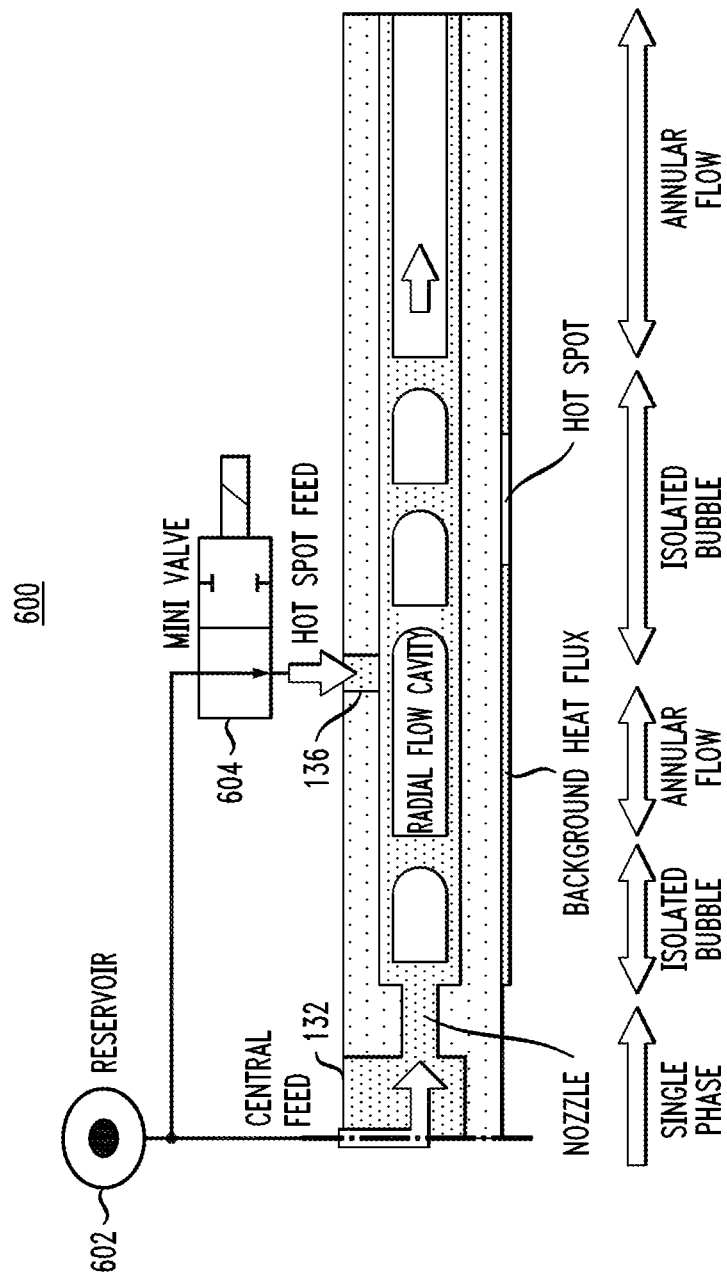
FIG. 6 illustrates a system for cooling a hot spot region of a chip in a chip package structure that implements two phase cooling with radial liquid-vapor flow, according to an embodiment of the invention.

As shown in FIG. 1, an optional local feed inlet 136 can be implemented to locally inject liquid coolant directly to a hot spot region of a chip, to prevent local dry out at hot spot locations, or a change in vapor quality and hence flow regime. FIG. 6 illustrates a system 600 for cooling a hot spot region of a chip in a chip package structure that implements two phase cooling with radial liquid-vapor flow, according to an embodiment of the invention. The system generally includes a reservoir 602 for feeding liquid coolant to the central inlet 132 and the local feed inlet 136 via a valve device 604 that is used to modulate the injected refrigerant mass flow. Currently, most two-phase cooled systems are operated without measurement of the vapor quality because these measurements are very difficult and may require optical recognition of bubbles. The thermodynamic equilibrium quality is estimated based on the assumption that the liquid and vapor phases are saturated and the liquid enthalpy is calculated by carrying out an energy balance. It is unsafe to cool high-power devices with vapor qualities >0.6. To render a high vapor quality system stable, the mass flux should be tuned to the power of the chip stack. In accordance with an embodiment of the invention, this is achieved by a global dosing valve that is controlled using a feedback loop from a set of sensors that monitor the temperature difference between a central and peripheral area.

A high local temperature gradient along the flux direction and temporal instabilities is the sign of a local dry-out and requires an increase in mass flux. A safe operation requires very fast thermal sensors that can be implemented using Resistance Temperature Detectors (RTDs) on chips. The benefit of the lateral gradient measurement is that an imminent dry-out can be detected before any harm is done on the electronics. An array of temperature sensors can be disposed along the flow path along with some electronics that interprets temperature gradients to indirectly measure vapor quality.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A method, comprising:
   supplying liquid coolant into a central inlet manifold formed through a central region of a chip stack, the chip stack comprising a plurality of conjoined chips disposed on a substrate;
   feeding liquid coolant into radial flow channels that are formed between pairs of conjoined chips in the chip stack, wherein the liquid coolant is fed into the radial flow channels through inlet nozzles formed along a sidewall of the central inlet manifold of the chip stack; and
   collecting heated liquid vapor that exits out from output ports of the radial flow channels around an outer periphery of the chip stack;
   wherein the radial flow channels are defined by forming a radial arrangement of guiding walls in spaces between the pairs of conjoined chips in the chip stack; and
   wherein the guiding walls extend in a radial direction between the central inlet manifold of the chip stack and the outer periphery of the chip stack to define radial flow channels which increase in width as the liquid and vapor flows in the radial direction from the central region of the chip stack to the outer periphery of the chip stack.

2. The method of claim 1, wherein supplying liquid coolant into the central inlet manifold of the chip stack comprises:
   placing a package lid over the chip stack, wherein the package lid covers and encloses the chip stack and contacts the substrate around the outer periphery of the chip stack to define a peripheral output manifold region within an interior region of the package lid which surrounds the outer periphery of the chip stack; and
   supplying the liquid coolant through a central inlet of the package lid, wherein the central inlet is aligned to the central inlet manifold of the chip stack to supply liquid coolant to the central inlet manifold.

3. The method of claim 2, wherein collecting the heated liquid vapor comprises collecting the heated liquid vapor though a peripheral outlet of the package lid, wherein the peripheral outlet of the package lid is aligned to the peripheral output manifold region within the interior region of the package lid.

4. The method of claim 1, further comprising forming the inlet nozzles along the sidewall of the central inlet manifold of the chip stack to have different sizes, wherein an inlet nozzle facing towards a corner region of the chip stack is larger than an inlet nozzle facing towards a side of the chip stack.

5. The method of claim 1, further comprising forming the guiding walls and inlet nozzles on the surfaces of the chips using a layer of polymer material or metallic material.

6. The method of claim 1, further comprising forming the guiding walls and inlet nozzles by etching surfaces of the chips to pattern the guiding walls and inlet nozzles.

7. The method of claim 1, further comprising arranging one or more of the guiding walls to guide a flow of liquid coolant and heated liquid vapor towards a hot spot region in a given region of the chip stack.

8. The method of claim 1, further comprising arranging one or more of the guiding walls to guide a flow of liquid coolant and heated liquid vapor to a given zone in proportion to a total power density of the given zone or a cooling requirement.

9. The method of claim 1, further comprising arranging the guiding walls to form radial flow channels that are fed by different inlet nozzles of the central inlet manifold.

10. The method of claim 9, wherein, a cross-sectional area of an inlet nozzle feeding a radial flow channel that extends towards a corner of the chip stack is greater than a cross-sectional area of an inlet, nozzle feeding a radial flow channel that extends toward a side of the chip stack.

11. The method of claim 1, further comprising arranging the guiding walls to form a hierarchical arrangement of radial flow channels.

12. The method of claim 11, wherein in the hierarchical arrangement of radial flow channels, a given radial flow channel is divided into at least two separate radial flow channels at some radial distance from a center point of the central input manifold of the chip stack, wherein each of the two separate radial flow channels are fed by different inlet nozzles that are formed in the given radial flow channel.

13. The method of claim 1, further comprising supplying liquid coolant to a target region of the chip stack through a local input manifold of the chip stack.

14. The method of claim 13, wherein target region comprises a hot spot of the chip stack.

15. The method of claim 13, further comprising controllably supplying the liquid coolant to the target region of the chip stack to modulate a local vapor quality at the target region.

16. The method of claim 1, further comprising forming the chip stack by conjoining adjacent chips in the chip stack using micro solder ball connections.

17. The method of claim 16, wherein the radial flow channels are defined, at least in part, by a space between surfaces of two adjacent chips in the chip stack that are conjoined back to back using the micro solder ball connections.

18. The method of claim 17, wherein the radial flow channels are further defined, at least in part, by etched channels that are formed in the surfaces of the two adjacent chips.

19. The method of claim 16, wherein at least some of the micro solder ball, connections provide electrical connections between through-silicon vias that are formed in the conjoined adjacent chips.

* * * * *